June 1, 1965 R. E. HUNT 3,186,065

SEMICONDUCTOR DEVICE AND METHOD OF MANUFACTURE

Filed June 10, 1960 2 Sheets-Sheet 1

INVENTOR
ROBERT E. HUNT
BY David M. Keay
AGENT

SEMICONDUCTOR DEVICE AND METHOD OF MANUFACTURE

Filed June 10, 1960 2 Sheets-Sheet 2

INVENTOR
ROBERT E. HUNT
BY David M. Keay
AGENT

United States Patent Office 3,186,065
Patented June 1, 1965

3,186,065
SEMICONDUCTOR DEVICE AND METHOD OF MANUFACTURE

Robert E. Hunt, Reading, Mass., assignor to Sylvania Electric Products Inc., a corporation of Delaware
Filed June 10, 1960, Ser. No. 35,364
3 Claims. (Cl. 29—155.5)

This invention relates to semiconductor electrical translating devices. More particularly, it is concerned with junction transistors and with methods of mounting and making electrical connections to their electrically active elements.

One well known type of semiconductor electrical translating device is the alloyed junction transistor. The electrically active elements of this device include a thin chip or die of a semiconductor material, such as germanium or silicon of one conductivity type, with opposite conductivity type imparting electrodes alloyed into the die from two opposite surfaces to form the emitter and collector. A base connection or tab which provides an ohmic base contact to the bulk of the semiconductor die may also be considered as part of the active elements. The active elements of devices of this type are usually enclosed in an envelope or housing to protect them from physical damage and from contamination by the atmosphere. The envelope has leads sealed therethrough which are connected to the active elements so as to provide separate electrical connections from each of the electrodes and the base tab to the exterior of the envelope. Commonly the envelope is in the form of a two-part container which includes a stem or base section through which the leads are sealed so as to be insulated from each other and a cap or cover section. When this form of envelope is employed, the active elements are mounted on the base section, electrical connections are made from the electrodes and base tab to the leads, and then the cover is sealed to the base section so as to enclose the active elements.

The active elements may be mounted on the base section by attachment of the base tab to the metal casing or body of the base section or to a base lead. An electrical connection is made from the emitter electrode to one of the leads by soldering a short length of fine wire to the lead and to the electrode. A similar connection is also made from the collector electrode to another lead. Typically, these connections are made individually for each device by an operator employing tweezers, scissors, solder, and a small soldering iron, while observing the operation through a microscope. The time and precision required for an operator to position the end of a piece of wire against an electrode and make a properly soldered connection may be more readily appreciated when it is realized that the electrodes commonly are of the order of 10 to 20 mils in diameter and the wire is about 3 mils in diameter.

It is an object of the present invention, therefore, to provide an improvde method of making electrical connections to the active elements of a semiconductor device.

It is a more specific object of the invention to provide an improved method of mounting the active elements of an alloyed junction semiconductor device on the base section of an envelope and making electrical connections between the active elements and the leads of the base section.

It is also an object of the invention to provide an improved semiconductor device having supporting structure and electrical connections for the electrically active elements which permit simplified and efficient assembly of the active elements therewith.

Briefly, in accordance with the objects of the present invention a body of semiconductor material having an electrode on one surface is mounted with the electrode adjacent but spaced from a lead or contact member. The lead is then elongated as by crimping or otherwise deforming a section of the lead in order to reduce the cross-sectional area of that section and move a portion of the lead into contact with the electrode.

In employing the invention for attaching the active elements of an alloyed junction transistor to the leads of the base section of a two-part envelope, the leads are first formed in order to orient them in a predetermined arrangement for receiving the active elements. When the active elements are mounted on the base section, one ot the leads holds the active elements in position on the base section and the ends of the other two leads are spaced apart by a distance greater than the thickness of the active elements with the end of each of the leads adjacent a different one of the electrodes so that the end of at least one of the leads is spaced from its adjacent electrode. Electrical contact between the leads and their adjacent associated electrodes is then obtained by crimping to narrow a section of a lead in order to advance the end of the lead toward its adjacent electrode a distance sufficient to cause each lead to make contact with its adjacent electrode. If the electrode is of sufficiently malleable material and the diameter of the lead is small relative to the electrode diameter, the ends of the leads may penetrate the electrodes so that after the crimping operation the lead ends may be separated from each other by a distance slightly less than the thickness of the active elements.

Prior to the mounting of the active elements on the base section, the portions of the base section which will come in contact with the active elements may be coated with a solder material. Then, after contact has been made between the leads and the electrodes, the assembled unit may be heated for a short period in a reducing atmosphere to provide improved mechanical and electrical soldered connections.

Additional objects, features, and advantages of the present invention will be apparent from the following detailed discussion and the accompanying drawings wherein.

Figure 1:
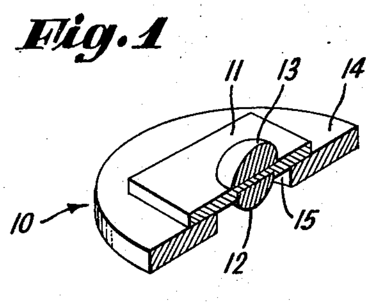
FIG. 1 is a perspective view in cross-section of the electrically active elements of an alloyed junction transistor.
Figure 4:
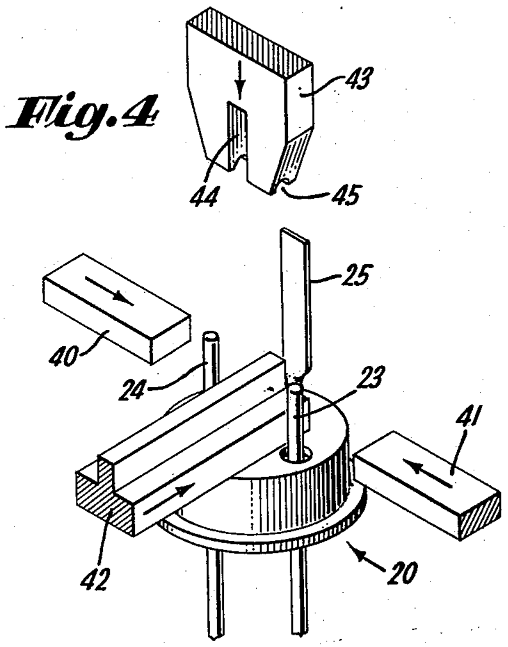
Figure 2:
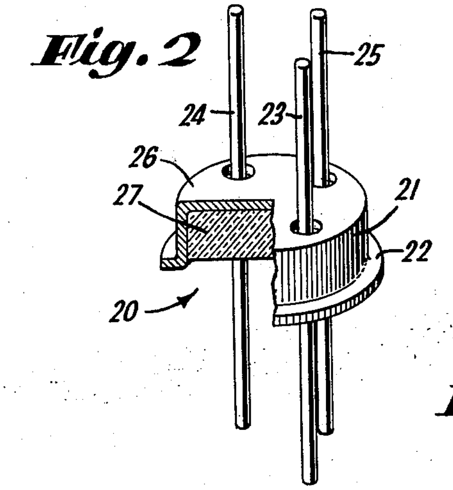
FIG. 2 is a perspective view of the base section of a two-part envelope or housing onto which the active elements of FIG. 1 are to be mounted, including the leads to which the elements are to be connected.
Figure 5:
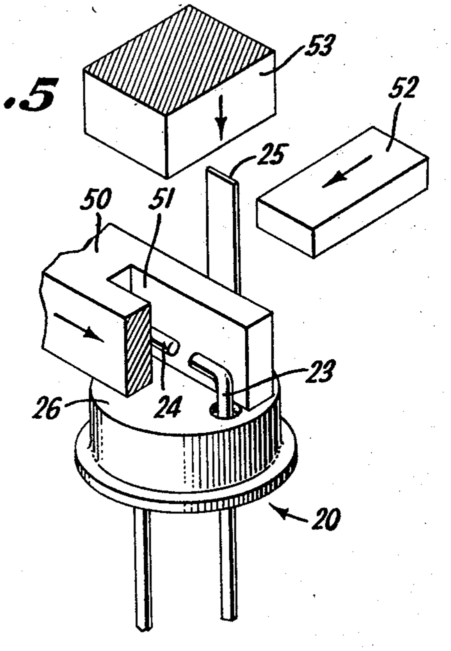
Figure 3:
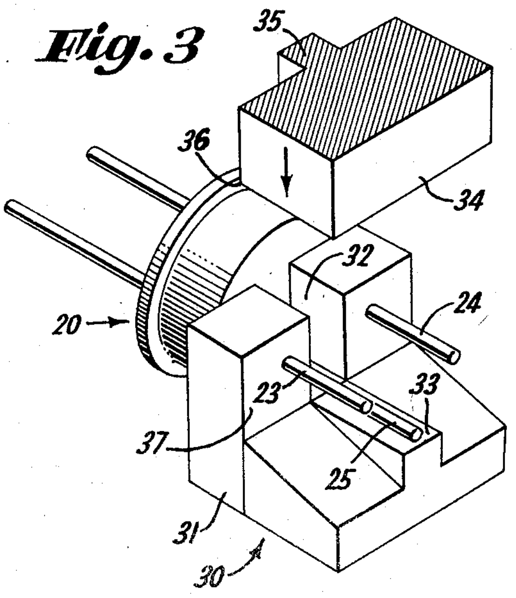
Figure 6:
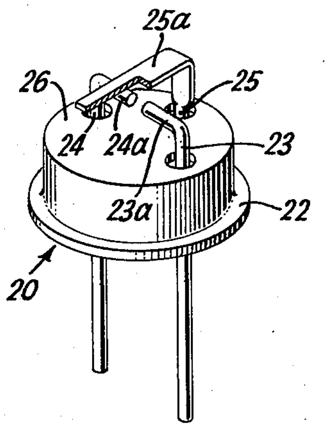
Figure 8:
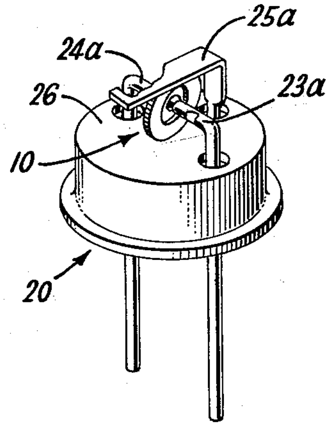
Figure 7:
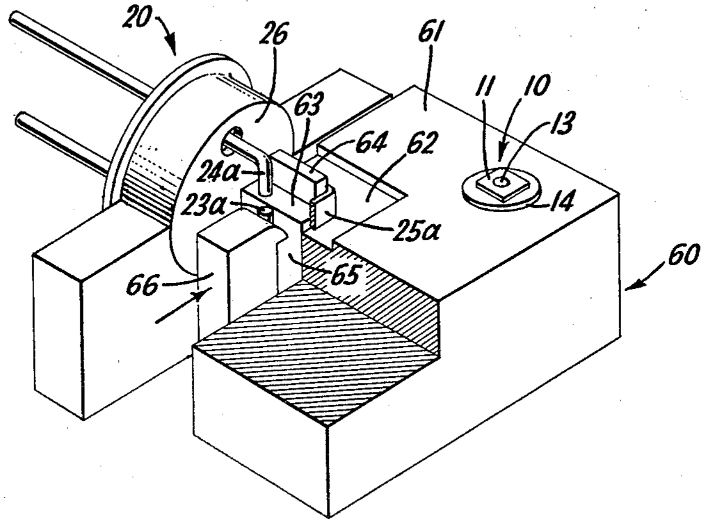

FIGS. 3, 4, and 5 are perspective views illustrating steps in forming the leads of the base section shown in FIG. 2 preparatory to mounting the active elements thereon;

FIG. 6 is a perspective view of the base section prepared in accordance with the steps illustrated in FIGS. 3, 4, and 5;

FIG. 7 is a perspective view illustrating the mounting of the active elements of an alloyed junction transistor of FIG. 1 on the prepared base section of FIG. 6 and the making of contact between the leads and the active elements; and FIG. 8 is a perspective view of an assembled alloyed junction transistor produced in accordance with the teachings of the invention.

The active elements 10 of an alloyed junction transistor as shown in FIG. 1 include a chip or die 11 of a semiconductor material having an emitter electrode 12 and a collector electrode 13 alloyed concentrically on opposite major surfaces. The die is soldered to a base tab 14 which provides ohmic contact to the bulk or base region of the transistor. The base tab is in the form of a washer having a central opening 15. The emitter electrode is recessed in this opening.

The stem or base section 20 of the envelope onto which the active elements are to be mounted as shown in FIG. 2 is a type of base section which is commonly employed together with a cover section to form enclosures for semiconductor devices. This base section includes a generally cylindrical metal casing 21 having at its periphery an outwardly turned rim 22 adapted for sealing to the cover section of the envelope (not shown). Three cylindrical metal leads 23, 24, and 25 pass through openings in the casing. The leads extend parallel to each other on both sides of the base mounting surface 26 to which they are perpendicular, and they are arranged in a circle concentric with the cylindrical casing. The emitter and collector leads 23 and 24 are located on a diameter of the circle and the base lead 25 is located at the same distance as the other leads from the center of the circle and equidistant from each of the other two leads. The leads are hermetically sealed in position by a layer or filler of glass 27 which forms a hermetic seal with the metal casing 21.

In the process of preparing the base section for receiving the active elements the diametrically opposite emitter and collector leads 23 and 24 are first cut at a precisely determined distance from the mounting surface 26 and the base lead 25 is flattened as illustrated in FIG. 3. The base section is placed in a fixture 30 with the emitter and collector leads extending through apertures in a plate 31 and with the base lead disposed in a notch 32 in the plate and lying on an anvil 33. A punch 34 having a projection 35 is actuated downward in the direction indicated by the arrow. The projection 35 fits in the notch 32 in the plate and the forward edge 36 of the punch slides along the face 37 of the plate through which the leads extend. Movement of the punch thus shears off the emitter and collector leads so that their length is equal to the thickness of the plate. The bottom of the punch 34 including the projection compresses the base lead against the anvil 33 and flattens it along the major portion of its length.

After the leads have been appropriately shortened to the proper length or flattened, the emitter and collector leads 23 and 24 are bent toward each other as is illustrated in FIG. 4. The upper portions of the two leads are forced toward each other by side dies 40 and 41 moving along a straight line in opposite directions as indicated by the arrows. The leads are forced across the laterally extending arms of an inverted T-shaped die 42 the upright leg of which limits the extent to which the leads can be moved toward each other. The side dies are withdrawn and a top die 43 is moved downward in the direction indicated by the arrow. The top die has a slot 44 which permits the die to bridge the leg of the T-die and a groove 45 for engaging the leads. This die forces the upper portions of the two leads downward against the arms of the T-die while the leg of the T-die insures that the ends of the leads remain separated by a fixed distance equal to the thickness of the leg. The groove 45 in the die insures that the horizontal upper portions of the leads lie along a straight line. The dimensions of the T-die are such that the ends of the leads are separated by a distance slightly greater than the thickness of the assembly of active elements and the height of the ends above the mounting surface is approximately equal to the radius of the base tab.

Next, the flattened base lead 25 is bent to provide a portion lying generally parallel to the surface of the base and perpendicular to the line along which the horizontal portions of the other two leads lie. The portion of the lead is disposed at a distance from the surface slightly less than the diameter of the base tab of the active elements. As illustrated in FIG. 5 a bifurcated die 50 having a slot 51 which accommodates the bent emitter and collector leads is placed on the mounting surface 26 of the base section in contact with the flattened base lead. A back die 52 is moved forward as indicated by the arrow, pushing the upper portion of the lead across the bottom die 50. The back die is then withdrawn and a top die 53 is moved downward as indicated by the arrow forcing the upper portion of the lead into contact with the bottom die and placing it above the ends of the other two leads at the proper distance from the surface of the base section.

The base section 20 obtained from the foregoing series of lead preforming operations is shown in FIG. 6. The emitter and collector leads 23 and 24 have horizontal portions 23*a* and 24*a* bent at 90° to the remaining portions of the leads and extending toward each other. These two portions lie at a predetermined distance from the surface of the base section equal to the distance from the center of an electrode to the edge of the base tab. The ends of the emitter and collector leads are separated by a predetermined distance slightly greater than the thickness of the active elements. A portion 25*a* of the base lead 25 lies generally parallel to the mounting surface 26 at a distance therefrom slightly less than the diameter of the base tab and extends over the region of the ends of the other two leads. After the leads have been formed, the base section is dipped in solder with the bent portions of the leads downward so as to provide a coating of solder metal over the mounting surface and the bent leads. Solder is not placed on the casing in the region of the rim 22 since the cap or cover of the envelope is usually sealed to the rim by welding.

Mounting of the active elements 10 shown in FIG. 1 on the prepared base section 20 shown in FIG. 6 and the making of electrical connections between the active elements and the appropriate leads is illustrated in FIG. 7. The assembly fixture 60 in which these steps are carried out has a flat upper surface 61. A slight depression 62 in the surface defines a small pedestal 63 having its upper surface in the plane of the upper surface of the fixture. With the mounting surface 26 of the base section snugly against the fixture, the flattened base lead fits around the pedestal and a projection 64 adjacent the pedestal as shown in FIG. 7. This lead rests in the depression about half above and half below the plane of the upper surface of the fixture. The portion 23*a* of the emitter lead bears against a vertical surface 65 of the fixture which is perpendicular to the mounting surface 26 of the base section. A crimping die 66 which has its upper surface generally in the plane of the upper surface 61 of the fixture is located in proximity to the vertical surface and the emitter lead.

When the base section is in position as shown in FIG. 7, the active elements 10 of a transistor are placed on the upper surface of the fixture with the semiconductor die 11 and the collector electrode 13 upward. The active elements are then slid across the top of the crimping die 66 between the ends of the collector and emitter leads and along the pedestal 63 until the base tab 14 abuts the projection 64. Since the depth of the depression 62 is about one half the width of the flat lead and the distance between the mounting surface 26 and the upper portion 25*a* of the base lead is slightly less than the diameter of the base tab, the base lead holds the tab gently but firmly against the mounting surface. The relative dimensions of the preformed leads, the active elements, and the parts of the fixture are such that the collector electrode is located closely adjacent the end of the collector lead and the emitter electrode is located closely adjacent the end of the emitter lead.

With all the various elements located in the proper relative positions as described above, the crimping die 66 is actuated in the direction indicated by the arrow. The upper portion 23*a* of the emitter lead is compressed between the crimping die and the vertical surface 65 of the fixture, and the section of the lead contacted by the die is reduced in cross-sectional area. The configuration of the die is such that as the lead is reduced in the section being compressed, the displaced metal is moved primarily upward. Thus, the portion 23*a* of the emitter lead lying parallel to the surface of the base section is elongated and the end of the lead advances upward toward the emitter electrode of the active elements. The amount of movement is such that the ultimate spacing between the ends of the leads is reduced to a distance substantially equal to, but no greater than, the thickness of the semiconductor die and electrodes, and thus contact is established between each of the leads and its associated electrode. Some movement of the active elements toward the collector lead can be tolerated during this operation since the base tab is only frictionally held between the base lead and the mounting surface.

In the assembled transistor as can be seen in FIG. 8 the base mounting surface and the leads themselves constitute the supporting structure and the electrical connections for the electrically active elements. In order to form strong mechanical and electrical connections at the points at which the mounting surface and leads contact the active elements the assembled unit is heated to form soldered connections at these points. The unit may be treated as by passing it through a furnace with a reducing atmosphere or by dipping it in hot flux at an elevated temperature which causes the solder to flow. After the heat treatment and subsequent cooling of the assembled unit, it is ready for final processing steps such as etching, cleaning, baking, and sealing of a suitable cap or cover to the base section of the container.

In the fabrication of a typical device according to the invention, a standard cylindrical container having a base section 20 with .017 inch diameter Dumet wire leads was employed. The metal casing 21, which was of steel, and the leads were gold plated. The electrically active transistor elements included a die 11 of P-type germanium 75 mils square and 1.6 mils thick. Centered on the opposite major surfaces of the die were emitter and collector electrodes 12 and 13 of lead-arsenic and lead-antimony, respectively, which had been alloyed to the die. These electrodes were generally hemispherical in shape, the collector electrode having a diameter of about 19 mils and a height of about 8 mils, the emitter electrode having a diameter of about 16 mils and height of about 6 mils. Soldered to the die was a nickel circular washer or base tab 14 .112 inch in diameter and 6.7 mils thick, including the solder layer. The inside diameter of the base tab was approximately 36 mils and the emitter electrode was centered within the opening 15 in the tab.

The leads of the base section were formed so as to locate properly with respect to each other and the mounting surface those portions of the leads which were to contact the active elements. Originally the leads extended .250 inch above the surface of the base section. The emitter and collector leads 23 and 24 were shortened to about .125 inch and the base lead 25 was flattened so as to be about 40 mils wide and 6 mils thick. The emitter and collector leads were bent so as to place the upper portions **23*a* and 24*a*** parallel to the mounting surface about 56 mils above the surface and to leave their ends spaced apart about 18 to 20 mils. The base lead was bent so as to lie about 1/10 inch above the surface. After the leads were formed, the base section was dipped in tin-lead eutectic solder to coat the bent leads and the mounting surface.

When the active elements were positioned on the base section, the base tab was held against the mounting surface by the flattened base lead 25. The emitter lead 23 was deformed so as to elongate it sufficiently to establish firm contact between the end of each lead and its associated electrode. The assembled unit was placed in a flux consisting of one part by weight of ammonium chloride and three parts by weight of zinc chloride at a temperature of 300° C. for 12 seconds. This treatment caused the solder to flow between the portions of the base section contacting the active elements and the points of contact on the active elements. The assembly of the base section and active elements was subsequently etched and cleaned, and a cover was welded to the base section at the rim in accordance with usual processing techniques to form the completed device.

What is claimed is:

1. The method of attaching a semiconductor body having two opposite parallel surfaces with an electrode concentrically arranged on each of said opposite surfaces to a base section having two contact leads including portions disposed along a line and extending toward each other with their ends spaced apart a distance slightly greater than the thickness of said semiconductor body and electrodes, and having a contact member with a portion thereof disposed in the region of the ends of said leads, each of said leads and said contact member being electrically insulated from the others, said method including the steps of placing the semiconductor body and electrodes between the ends of said leads with the body making electrical contact to said contact member and with each of the electrodes adjacent the end of a different one of the leads and with one of the electrodes spaced from its adjacent lead; and reducing the cross section of a lead in said portion of the lead to advance the end of that lead and force the electrodes and leads into electrical contact.

2. The method of producing a semiconductor device from a body of semiconductor material having alloyed junction electrodes concentrically attached on opposite parallel surfaces thereof and a base section having two leads and a contact member thereon which are electrically insulated from each other including the steps of forming the two leads of the base section with portions thereof disposed along a line and extending toward each other with their ends spaced apart a distance slightly greater than the thickness of the body of semiconductor material and the electrodes; placing the body of semiconductor material between the ends of said leads with each of the electrodes adjacent the end of a different one of the leads, one of the electrodes being spaced from its adjacent lead, and with the body of semiconductor material in electrical contact with the contact member; and deforming a section of said portion of one of said leads by reducing the cross-sectional area of the section thereby advancing the end of said one of said leads so that the distance between the ends of the leads is no greater than the thickness of the body of semiconductor material and electrodes.

3. The method of connecting the active elements of an alloyed junction transistor to a base section, the active elements including a die of semiconductor material having alloyed junction electrodes concentrically attached on opposite parallel major surfaces thereof and a base tab attached to one of said surfaces of said die, said tab having an aperture therein within which one of said electrodes is recessed, the base section having a mounting surface and three leads electrically insulated from each other extending through said mounting surface and perpendicular thereto, said method including the steps of forming the first and second of said leads to orient a portion of each along a line parallel to said mounting surface at a distance from the mounting surface equal to the distance from one edge of the base tab to an electrode of said active elements and with the ends of the leads separated by a distance slightly greater than the thickness of the die and alloyed electrodes; forming said third lead to orient a portion thereof across the region of the ends of the first and second leads at a distance from the mounting surface slightly less than the distance from the one edge of the base tab to the opposite edge of the base tab; coating the ends of the first and second leads, said portion of the third lead, and said mounting surface with solder metal; placing the active elements between the ends of the first and second leads with said one edge of the base tab on the mounting surface and the opposite edge in contact with the portion of the third lead, said base tab being held between the portion of the third lead and the mounting surface, and with the electrodes disposed along the line of said portions of the first and second leads; crimping a section of said portion of one of said first and second leads to reduce the cross-sectional area of the section and cause the end of the one lead to advance toward the end of the other lead so that the spacing between the ends of the leads is reduced to a distance no greater than the thickness of the die and alloyed electrodes; heating said active elements and said base section to a temperature permitting said solder metal to flow; and subsequently permitting said active elements and said base section to cool.

References Cited by the Examiner

UNITED STATES PATENTS

| | | | |
|---|---|---|---|
| 2,580,910 | 1/52 | Harman | 29—155.55 X |
| 2,829,422 | 4/58 | Fuller | 29—25.3 |
| 2,830,920 | 4/58 | Colson et al. | 317—235 |
| 2,842,723 | 7/58 | Koch et al. | 317—235 |
| 2,842,831 | 7/58 | Pfann | 29—25.3 |
| 2,849,664 | 8/58 | Beale | 317—235 |
| 2,854,074 | 9/58 | Frank et al. | 29—155.55 |
| 2,854,160 | 9/58 | Waters et al. | 317—235 |
| 2,859,142 | 11/58 | Pfann | 148—1.4 |
| 2,882,462 | 4/59 | Zierdt | 317—235 |
| 2,918,719 | 12/59 | Armstrong | 148—1.5 |
| 2,981,875 | 4/61 | Kelley et al. | 317—235 |

FOREIGN PATENTS

| | | |
|---|---|---|
| 298,061 | 6/15 | Germany. |

DAVID J. GALVIN, *Primary Examiner.*

LLOYD McCOLLUM, JAMES D. KALLAM, *Examiners.*